(12) United States Patent
Li et al.

(10) Patent No.: US 8,959,414 B2
(45) Date of Patent: Feb. 17, 2015

(54) SYSTEMS AND METHODS FOR HYBRID LAYER DATA DECODING

(71) Applicant: LSI Corporation, San Jose, CA (US)

(72) Inventors: Shu Li, San Jose, CA (US); Shaohua Yang, San Jose, CA (US); Fan Zhang, Milpitas, CA (US); Chung-Li Wang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 116 days.

(21) Appl. No.: 13/918,510

(22) Filed: Jun. 14, 2013

(65) Prior Publication Data

US 2014/0372828 A1    Dec. 18, 2014

Related U.S. Application Data

(60) Provisional application No. 61/834,557, filed on Jun. 13, 2013.

(51) Int. Cl.
*H03M 13/00* (2006.01)
*G06F 11/10* (2006.01)

(52) U.S. Cl.
CPC ........................... *G06F 11/10* (2013.01)
USPC ........................... 714/758; 714/774

(58) Field of Classification Search
USPC ................................... 714/758, 774
See application file for complete search history.

(56) References Cited

U.S. PATENT DOCUMENTS

| | | |
|---|---|---|
| 4,553,221 A | 11/1985 | Hyatt |
| 4,805,174 A | 2/1989 | Kubota |
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,351,274 A | 9/1994 | Chennakeshu |
| 5,392,299 A | 2/1995 | Rhines |
| 5,406,593 A | 4/1995 | Chennakeshu |
| 5,417,500 A | 5/1995 | Martinie |
| 5,450,253 A | 9/1995 | Seki |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,696,504 A | 12/1997 | Oliveros |
| 5,710,784 A | 1/1998 | Kindred |
| 5,717,706 A | 2/1998 | Ikeda |
| 5,719,871 A | 2/1998 | Helm |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar |
| 6,029,264 A | 2/2000 | Kobayashi |
| 6,065,149 A | 5/2000 | Yamanaka |

(Continued)

OTHER PUBLICATIONS

U.S. Appl. No. 13/426,714, filed Mar. 22, 2012, Shaohua Yang.

(Continued)

*Primary Examiner* — M. Mujtaba K Chaudry (74) *Attorney, Agent, or Firm* — Hamilton DeSanctis & Cha (57) ABSTRACT

The present inventions are related to systems and methods for data processing, and more particularly to systems and methods for performing data decoding.

20 Claims, 4 Drawing Sheets

(56) References Cited

U.S. PATENT DOCUMENTS

| | | |
|---|---|---|
| 6,097,764 A | 8/2000 | McCallister |
| 6,145,110 A | 11/2000 | Khayrallah |
| 6,175,588 B1 | 1/2001 | Visotsky |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,393,074 B1 | 5/2002 | Mandyam |
| 6,412,088 B1 | 6/2002 | Patapoutian et al. |
| 6,473,878 B1 | 10/2002 | Wei |
| 6,535,553 B1 | 3/2003 | Limberg et al. |
| 6,625,775 B1 | 9/2003 | Kim |
| 6,697,441 B1 | 2/2004 | Bottomley |
| 6,748,034 B2 | 6/2004 | Hattori |
| 6,757,862 B1 | 6/2004 | Marianetti, II |
| 6,785,863 B2 | 8/2004 | Blankenship |
| 6,807,238 B1 | 10/2004 | Rhee |
| 6,810,502 B2 | 10/2004 | Eidson |
| 6,839,774 B1 | 1/2005 | Ahn et al. |
| 6,970,511 B1 | 11/2005 | Barnette |
| 6,975,692 B2 | 12/2005 | Razzell |
| 6,986,098 B2 | 1/2006 | Poeppelman |
| 7,035,327 B2 | 4/2006 | Nakajima et al. |
| 7,047,474 B2 | 5/2006 | Rhee |
| 7,058,873 B2 | 6/2006 | Song et al. |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,136,244 B1 | 11/2006 | Rothberg |
| 7,184,486 B1 | 2/2007 | Wu |
| 7,191,378 B2 | 3/2007 | Eroz |
| 7,203,887 B2 | 4/2007 | Eroz |
| 7,230,550 B1 | 6/2007 | Mittal |
| 7,237,181 B2 | 6/2007 | Richardson |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,596,196 B1 | 9/2009 | Liu et al. |
| 7,646,829 B2 | 1/2010 | Ashley |
| 7,702,986 B2 | 4/2010 | Bjerke |
| 7,738,202 B1 | 6/2010 | Zheng |
| 7,752,523 B1 | 7/2010 | Chaichanavong |
| 7,779,325 B2 | 8/2010 | Song |
| 7,802,172 B2 | 9/2010 | Vila Casado |
| 7,952,824 B2 | 5/2011 | Dziak |
| 7,957,251 B2 | 6/2011 | Ratnakar |
| 7,958,425 B2 | 6/2011 | Chugg |
| 7,996,746 B2 | 8/2011 | Livshitz |
| 8,018,360 B2 | 9/2011 | Nayak |
| 8,020,069 B1 | 9/2011 | Feng |
| 8,020,078 B2 | 9/2011 | Richardson |
| 8,161,361 B1 | 4/2012 | Song et al. |
| 8,201,051 B2 | 6/2012 | Tan |
| 8,225,168 B2 | 7/2012 | Yu et al. |
| 8,237,597 B2 | 8/2012 | Liu |
| 8,255,765 B1 | 8/2012 | Yeo |
| 8,261,171 B2 | 9/2012 | Annampedu |
| 8,291,284 B2 | 10/2012 | Savin |
| 8,291,299 B2 | 10/2012 | Li |
| 8,295,001 B2 | 10/2012 | Liu |
| 8,296,637 B1 | 10/2012 | Varnica |
| 8,370,711 B2 | 2/2013 | Alrod |
| 8,381,069 B1 | 2/2013 | Liu |
| 8,413,032 B1 | 4/2013 | Song |
| 8,429,498 B1 | 4/2013 | Anholt |
| 8,443,267 B2 | 5/2013 | Zhong et al. |
| 8,458,555 B2 | 6/2013 | Gunnam |
| 8,464,142 B2 | 6/2013 | Gunnam |
| 8,634,317 B1* | 1/2014 | Yu .................. 370/252 |
| 2001/0010089 A1 | 7/2001 | Gueguen |
| 2001/0016114 A1 | 8/2001 | Van Gestel et al. |
| 2002/0021519 A1 | 2/2002 | Rae |
| 2002/0067780 A1 | 6/2002 | Razzell |
| 2002/0168033 A1 | 11/2002 | Suzuki |
| 2003/0031236 A1 | 2/2003 | Dahlman |
| 2003/0123364 A1 | 7/2003 | Nakajima et al. |
| 2003/0138102 A1 | 7/2003 | Kohn et al. |
| 2003/0147168 A1 | 8/2003 | Galbraith et al. |
| 2003/0188252 A1 | 10/2003 | Kim |
| 2004/0042436 A1 | 3/2004 | Terry et al. |
| 2004/0194007 A1 | 9/2004 | Hocevar |
| 2004/0228021 A1 | 11/2004 | Yamazaki |
| 2005/0047514 A1 | 3/2005 | Bolinth |
| 2005/0149842 A1 | 7/2005 | Kyung |
| 2005/0210367 A1 | 9/2005 | Ashikhmin |
| 2005/0243456 A1 | 11/2005 | Mitchell et al. |
| 2006/0002689 A1 | 1/2006 | Yang et al. |
| 2006/0159355 A1 | 7/2006 | Mizuno |
| 2007/0234178 A1 | 10/2007 | Richardson |
| 2007/0297496 A1 | 12/2007 | Park et al. |
| 2008/0037676 A1 | 2/2008 | Kyung |
| 2008/0069373 A1 | 3/2008 | Jiang |
| 2008/0140686 A1 | 6/2008 | Hong |
| 2008/0304558 A1 | 12/2008 | Zhu et al. |
| 2009/0003301 A1 | 1/2009 | Reial |
| 2009/0092174 A1 | 4/2009 | Wang |
| 2009/0106633 A1 | 4/2009 | Fujiwara |
| 2009/0125780 A1 | 5/2009 | Taylor |
| 2009/0132893 A1 | 5/2009 | Miyazaki |
| 2009/0150745 A1 | 6/2009 | Langner et al. |
| 2009/0177852 A1 | 7/2009 | Chen |
| 2009/0185643 A1 | 7/2009 | Fitzpatrick |
| 2009/0273492 A1 | 11/2009 | Yang et al. |
| 2009/0300461 A1* | 12/2009 | Shor et al. .................. 714/752 |
| 2010/0020865 A1* | 1/2010 | Xia et al. .................. 375/240.01 |
| 2010/0077276 A1 | 3/2010 | Okamura et al. |
| 2010/0088575 A1 | 4/2010 | Sharon et al. |
| 2010/0150252 A1 | 6/2010 | Camp |
| 2010/0172046 A1 | 7/2010 | Liu et al. |
| 2010/0241921 A1 | 9/2010 | Gunam |
| 2010/0268996 A1 | 10/2010 | Yang |
| 2010/0322048 A1 | 12/2010 | Yang et al. |
| 2010/0325511 A1 | 12/2010 | Oh |
| 2011/0041040 A1 | 2/2011 | Su |
| 2011/0043938 A1 | 2/2011 | Mathew |
| 2011/0167227 A1 | 7/2011 | Yang |
| 2011/0258508 A1 | 10/2011 | Ivkovic |
| 2011/0264987 A1 | 10/2011 | Li |
| 2011/0307760 A1 | 12/2011 | Pisek |
| 2011/0320902 A1 | 12/2011 | Gunnam |
| 2012/0020402 A1 | 1/2012 | Ibing |
| 2012/0038998 A1 | 2/2012 | Mathew |
| 2012/0063023 A1 | 3/2012 | Mathew |
| 2012/0079353 A1 | 3/2012 | Liikanen |
| 2012/0124118 A1 | 5/2012 | Ivkovic |
| 2012/0182643 A1 | 7/2012 | Zhang |
| 2012/0185744 A1 | 7/2012 | Varnica |
| 2012/0207201 A1 | 8/2012 | Xia |
| 2012/0212849 A1 | 8/2012 | Xu |
| 2012/0236428 A1 | 9/2012 | Xia |
| 2012/0262814 A1 | 10/2012 | Li |
| 2012/0265488 A1 | 10/2012 | Sun |
| 2012/0317462 A1 | 12/2012 | Liu et al. |
| 2013/0024740 A1 | 1/2013 | Xia |
| 2013/0031440 A1 | 1/2013 | Sharon |
| 2013/0120169 A1 | 5/2013 | Li |
| 2013/0215972 A1* | 8/2013 | Jax et al. .................. 375/240.23 |
| 2014/0229806 A1* | 8/2014 | Li et al. .................. 714/785 |

OTHER PUBLICATIONS

Casado et al., Multiple-rate low-density parity-check codes with constant blocklength, IEEE Transactions on communications, Jan. 2009, vol. 57, pp. 75-83.

(56) References Cited

OTHER PUBLICATIONS

Cui et al., "High-Throughput Layered LDPC Decoding Architecture", IEEE Transactions on Very Large Scale Integration (VLSI) Systems, vol. 17, No. 4 (Apr. 2009).
Fan et al., "Constrained coding techniques for soft iterative decoders" Proc. IEEE Global Telecommun. Conf., vol. 1b, pp. 631-637 (1999).
Fossorier, Marc P.C. "Quasi-Cyclic Low-Density Parity-Check Codes From Circulant Permutation Maricies" IEEE Transactions on Information Theory, vol. 50, No. 8 Aug. 8, 2004.
Gross, "Stochastic Decoding of LDPC Codes over GF(q)", HDPCC Workshop, Tel Aviv (Mar. 2, 2010).
Gunnam et al., "VLSI Architectures for Layered Decoding for Irregular LDPC Codes of WiMax", IEEE ICC Proceedings (2007).
Lin et al "An efficient VLSI Architecture for non binary LDPC decoders"—IEEE Transaction on Circuits and Systems II vol. 57, Issue 1 (Jan. 2010) pp. 51-55.
Moon et al, "Pattern-dependent noise prediction in signal-dependent Noise," IEEE JSAC, vol. 19, No. 4 pp. 730-743, Apr. 2001.
Moon et al., "Maximum transition run codes for data storage systems", IEEE Trans. Magn., vol. 32, No. 5, pp. 3992-3994 (Sep. 1996).
Patapoutian et al "Improving Re-Read Strategies by Waveform Averaging" IEEE Transactions on Mag. vol. 37 No. 6, Nov. 2001.
Richardson, T "Error Floors of LDPC Codes" Flarion Technologies Bedminster NJ 07921, tjr@flarion.com (not dated).
Shokrollahi "LDPC Codes: An Introduction", Digital Fountain, Inc. (Apr. 2, 2003).
Spagnol et al, "Hardware Implementation of GF(2m) LDPC Decoders", IEEE Transactions on Circuits and Systemsši: Regular Papers, vol. 56, No. 12 (Dec. 2009).
Tehrani et al., "Fully Parallel Stochastic LDPC Decoders", IEEE Transactions On Signal Processing, vol. 56, No. 11 (Nov. 2008).
Todd et al., "Enforcing maximum-transition-run code constraints and low-density parity check decoding", IEEE Trans. Magn., vol. 40, No. 6, pp. 3566-3571 (Nov. 2004).
U.S. Appl. No. 13/227,416, filed Sep. 7, 2011, Lei Chen, Unpublished.
U.S. Appl. No. 13/295,150, filed Nov. 14, 2011, Zongwang Li, Unpublished.
U.S. Appl. No. 13/284,767, filed Oct. 28, 2011, Fan Zhang, Unpublished.
U.S. Appl. No. 13/770,008, filed Feb. 19, 2013, Shaohua Yang, Unpublished.
U.S. Appl. No. 13/227,544, filed Sep. 8, 2011, Shaohua Yang, Unpublished.
U.S. Appl. No. 13/186,234, filed Jul. 19, 2011, Haitao Xia, Unpublished.
U.S. Appl. No. 13/213,751, filed Aug. 19, 2011, Fan Zhang, Unpublished.
U.S. Appl. No. 13/283,549, filed Oct. 27, 2011, Wu Chang, Unpublished.
U.S. Appl. No. 13/180,495, filed Jul. 11, 2011, Chung-Li Wang, Unpublished.
U.S. Appl. No. 13/300,078, filed Nov. 18, 2011, Chung-Li Wang, Unpublished.
U.S. Appl. No. 13/305,510, filed Nov. 11, 2011, Lei Chen, Unpublished.
U.S. Appl. No. 13/305,551, filed Nov. 28, 2011, Yang Han, Unpublished.
U.S. Appl. No. 13/296,022, filed Nov. 14, 2011, Victor Krachkovsky, Unpublished.
U.S. Appl. No. 13/174,537, filed Jun. 30, 2011, Anantha Raman Krishnan, Unpublished.
U.S. Appl. No. 13/174,537, filed Jun. 30, 2011, Johnson Yen, Unpublished.
U.S. Appl. No. 13/171,615, filed Jun. 29, 2011, Bradley D. Seago, Unpublished.
U.S. Appl. No. 13/113,219, filed May 23, 2011, Yang Han, Unpublished.
U.S. Appl. No. 13/284,730, filed Oct. 28, 2011, Fan Zhang, Unpublished.
U.S. Appl. No. 13/269,832, filed Oct. 10, 2011, Haitao Xia, Unpublished.
U.S. Appl. No. 13/302,119, filed Nov. 22, 2011, Lei Chen, Unpublished.
U.S. Appl. No. 13/652,012, filed Oct. 15, 2012, Fan Zhang, Unpublished.
U.S. Appl. No. 13/621,341, filed Sep. 17, 2012, Shaohua Yang, Unpublished.
U.S. Appl. No. 13/269,852, filed Oct. 10, 2011, Haitao Xia, Unpublished.
U.S. Appl. No. 13/415,326, filed Mar. 8, 2012, Shaohua Yang, Unpublished.
U.S. Appl. No. 13/239,683, filed Sep. 22, 2011, Changyou Xu, Unpublished.
U.S. Appl. No. 13/989,583, filed Oct. 15, 2012, Shaohua Yang, Unpublished.
U.S. Appl. No. 13/483,100, filed May 30, 2012, Fan Zhang, Unpublished.
U.S. Appl. No. 13/483,105, filed May 30, 2012, Xuebin Wu, Unpublished.
U.S. Appl. No. 13/619,907, filed Sep. 14, 2012, Fan Zhang, Unpublished.
U.S. Appl. No. 13/705,407, filed Dec. 5, 2012, Lingyan Sun, Unpublished.
U.S. Appl. No. 13/415,430, filed Mar. 8, 2012, Nayak Ratnakar Aravind, Unpublished.
U.S. Appl. No. 13/746,301, filed Jan. 21, 2013, Shu Li, Unpublished.
U.S. Appl. No. 13/766,911, filed Feb. 14, 2013, Shaohua Yang, Unpublished.
U.S. Appl. No. 13/766,891, filed Feb. 14, 2013, Shu Li, Unpublished.
U.S. Appl. No. 13/875,357, filed May 5, 2013, Shaohua Yang, Unpublished.
U.S. Appl. No. 13/868,779, filed Apr. 23, 2013, Fan Zhang, Unpublished.
U.S. Appl. No. 13/853,711, filed Mar. 29, 2013, Shu Li, Unpublished.
U.S. Appl. No. 13/912,059, filed Jun. 6, 2013, Fan Zhang, Unpublished.
U.S. Appl. No. 13/426,693, filed Mar. 22, 2012, Shaohua Yang, Unpublished.
U.S. Appl. No. 13/445,848, filed Apr. 12, 2012, Bruce Wilson, Unpublished.
U.S. Appl. No. 13/426,714, filed Mar. 22, 2012, Shaohua Yang, Unpublished.
U.S. Appl. No. 13/372,580, filed Feb. 14, 2012, Fan Zhang, Unpublished.
U.S. Appl. No. 13/422,986, filed Mar. 16, 2012, Fan Zhang, Unpublished.
U.S. Appl. No. 13/362,409, filed Jan. 31, 2012, Fan Zhang, Unpublished.
U.S. Appl. No. 13/316,858, filed Dec. 12, 2011, Zongwang Li, Unpublished.
U.S. Appl. No. 13/597,001, filed Aug. 28, 2012, Fan Zhang, Unpublished.
U.S. Appl. No. 13/316,741, filed Dec. 12, 2011, Yang Han, Unpublished.
U.S. Appl. No. 13/445,878, filed Apr. 12, 2012, Yu Liao, Unpublished.
U.S. Appl. No. 13/412,520, filed Mar. 5, 2012, Fan Zhang, Unpublished.
U.S. Appl. No. 13/340,974, filed Dec. 30, 2011, Dan Liu, Unpublished.
U.S. Appl. No. 13/340,951, filed Dec. 30, 2011, Lei Chen, Unpublished.
U.S. Appl. No. 13/474,660, filed May 17, 2012, Zongwang Li, Unpublished.
U.S. Appl. No. 13/433,693, filed Mar. 29, 2012, Fan Zhang, Unpublished.
U.S. Appl. No. 13/545,833, filed Jul. 10, 2012, Zhi Bin Li, Unpublished
U.S. Appl. No. 13/596,819, filed Aug. 28, 2012, Shaohua Yang, Unpublished.
U.S. Appl. No. 13/369,468, filed Feb. 9, 2012, Zongwang Li, Unpublished.

(56) References Cited

OTHER PUBLICATIONS

U.S. Appl. No. 13/596,947, filed Aug. 28, 2012, Fan Zhang, Unpublished.
U.S. Appl. No. 13/596,978, filed Aug. 28, 2012, Fan Zhang, Unpublished.
U.S. Appl. No. 13/327,279, filed Dec. 15, 2011, Wei Feng, Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 3, 2007.
Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

SYSTEMS AND METHODS FOR HYBRID LAYER DATA DECODING

CROSS REFERENCE TO RELATED APPLICATIONS

The present application claims priority to (is a non-provisional of) U.S. Pat. App. No. 61/834,557, entitled "Systems and Methods for Hybrid Layer Data Decoding", and filed Jun. 13, 2013 by Li et al. The entirety of the aforementioned provisional patent application is incorporated herein by reference for all purposes.

FIELD OF THE INVENTION

The present inventions are related to systems and methods for data processing, and more particularly to systems and methods for performing data decoding.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. In some cases, data decoding fails to properly decode.

Hence, for at least the aforementioned reasons, there exists a need in the art for advanced systems and methods for data decoding.

BRIEF SUMMARY

The present inventions are related to systems and methods for data processing, and more particularly to systems and methods for performing data decoding Various embodiments of the present invention provide data processing systems that include a data decoder circuit. The data decoder circuit is operable to: select a combination of a first portion of a received codeword and a second portion of the received codeword as a first codeword layer; apply a data decode algorithm to the first codeword layer to yield a first decoded output; where the first decoded output converged, set soft data in the first decoded output to a value indicating a high probability of being correctly decoded; select a combination of a third portion of a received codeword and the second portion of the received codeword as a second codeword layer; and apply the data decode algorithm to the second codeword layer guided by the first decoded output to yield a second decoded output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 2b depicts the encoding circuit of FIG. 2a;

DETAILED DESCRIPTION OF THE INVENTION

The present inventions are related to systems and methods for data processing, and more particularly to systems and methods for performing data decoding.

Some embodiments of the present invention provide data processing systems that include both a data detector circuit and a data decoding circuit. Processing a data set through both the data detector circuit and the data decoder circuit is referred to herein as a global iteration. In some cases, multiple passes through the data decoder circuit may be made during a single global iteration. Such passes through the data decoder circuit are referred to herein as a local iteration. When all of the errors in a data set have been corrected through application of the data detection algorithm applied by the data detector circuit and the data decoding algorithm applied by the data decoder circuit, the processing is said to have converged.

Various embodiments of the present invention provide data processing systems that include a data decoder circuit. The data decoder circuit is operable to: select a combination of a first portion of a received codeword and a second portion of the received codeword as a first codeword layer; apply a data decode algorithm to the first codeword layer to yield a first decoded output; where the first decoded output converged, set soft data in the first decoded output to a value indicating a high probability of being correctly decoded; select a combination of a third portion of a received codeword and the second portion of the received codeword as a second codeword layer; and apply the data decode algorithm to the second codeword layer guided by the first decoded output to yield a second decoded output. In some cases, the data decode algorithm is a low density parity check algorithm. In some cases, the data processing system is implemented as part of an integrated circuit.

In various instances of the aforementioned embodiments, the data processing system further includes a data detector circuit operable to apply a data detection algorithm to a data input to yield a detected output where the received codeword is derived from the detected output. The data detection algorithm may be, but is not limited to, a maximum a posteriori data detection algorithm, or a Viterbi data detection algorithm. In some cases, the data processing system is part of a data storage device including a storage medium, and the data input is derived from the storage medium. In other cases the data processing system is part of a communication device operable to receive information from a data transfer medium, and the data input is derived from the information.

In various instances of the aforementioned embodiments, the data decoder circuit is further operable to set soft data in the second decoded output to a value indicating a high probability of being correctly decoded when the second decoded output converged. In some such instances, the data decoder circuit is further operable to provide a data output including a combination of the first decoded output and the second decoded output when both the first decoded output and the second decoded output converged.

In particular instances of the aforementioned embodiments, the data processing system further includes a data encoder circuit operable to encode a user data set to yield the received codeword. The first portion of the received codeword corresponds to a first component codeword and the third portion of the received codeword corresponds to a second component codeword.

Figure 1:
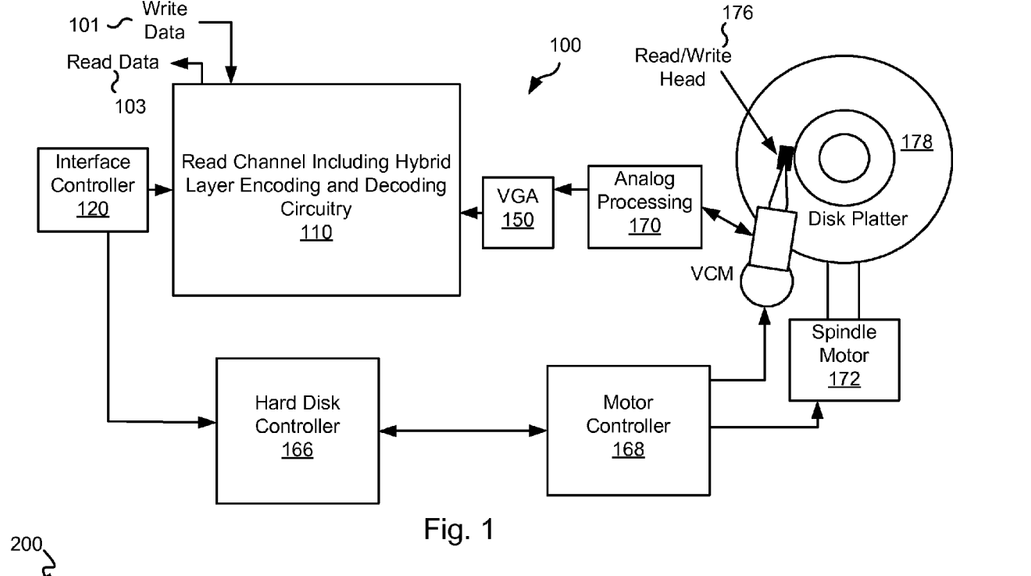
FIG. 1 shows a data processing circuit including hybrid layer encoding and decoding circuitry in accordance with one or more embodiments of the present invention.

Turning to FIG. 1, a storage system 100 including a read channel circuit 110 that includes hybrid layer encoding and decoding circuitry in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with a perpendicular recording scheme. For example, the magnetic signals may be recorded as either longitudinal or perpendicular recorded signals.

In a typical read operation, read/write head assembly 176 is accurately positioned by motor controller 168 over a desired data track on disk platter 178. The appropriate data track is defined by an address received via interface controller 120. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. The read data is provided as read data 103. A write operation is substantially the opposite of the preceding read operation with write data 101 being provided to read channel circuit 110. This data is then encoded and written to disk platter 178.

Writing data to disk platter 178 includes applying hybrid layer encoding to generate a hybrid layer codeword that is transferred to disk platter 178 via read/write head assembly. Such hybrid layer encoding may be done, for example, similar to that discussed below in relation to FIGS. 2a-2d. The hybrid layer encoding applies encoding that is used in relation to individual component codewords, and additional encoding that enhances the performance of encoded component codewords. This additional encoding is referred to generally herein as a hybrid encoding portion and is included with the component codewords to make up the hybrid layer codeword.

Reading data from disk platter includes applying both data detection and data decoding algorithms to the hybrid layer codeword to obtain the original user data. During the data decoding algorithm, hybrid layers including an individual component codeword and the hybrid portion are decoded over a number of local iterations. Where the individual component codeword converges, the soft data corresponding to the individual component codeword and the hybrid portion is set to a maximum value. In this way, the values in the hybrid portion are effectively frozen while the other hybrid layer formed of another individual component codeword and the hybrid portion is decoded. In this way, the added hybrid portion not only provides additional encoding that may be used to aid the data processing of a given component codeword, convergence of any of the component codewords will yield a known hybrid portion that further enhances the ability to correctly decode other component codewords within the hybrid layer codeword. Such decoding may be done using a circuit similar to that discussed below in relation to FIG. 3, and/or a process similar to that discussed below in relation to FIG. 4.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2A:
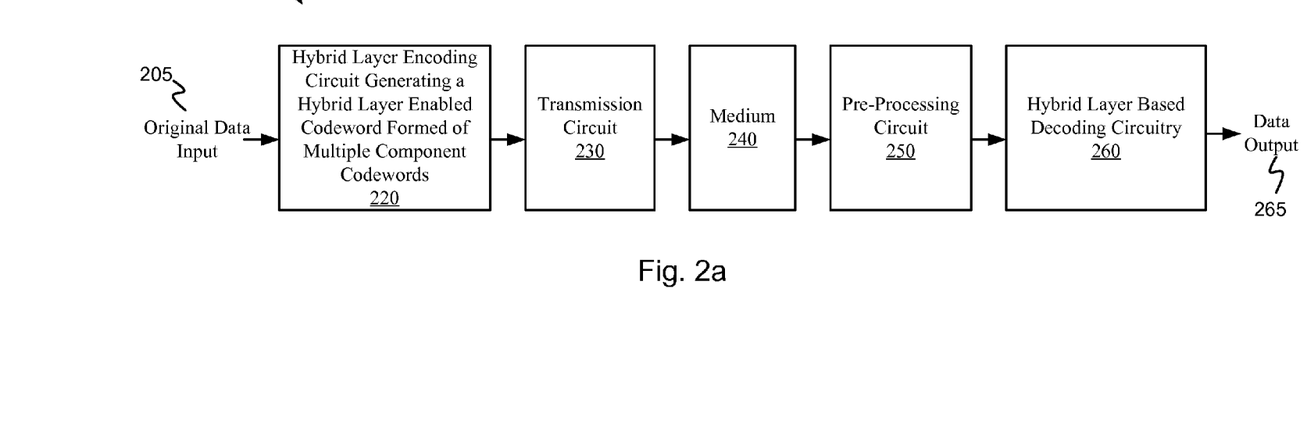
FIG. 2a depicts a data processing system including hybrid layer encoding and decoding circuitry in accordance with various embodiments of the present invention.

Turning to FIG. 2a, a data processing system 200 is shown that includes hybrid layer encoding and decoding circuitry in accordance with various embodiments of the present invention. Data processing system 200 includes a hybrid layer encoding circuit 220 that generates a hybrid layer codeword. The encoding is applied to an original data input 205 that includes multiple segments of data that are encoded together such that the resulting hybrid layer codeword includes two or more component codewords and a corresponding hybrid encoding portion that is the same across multiple component codewords. Original data input 205 may be any set of input data. For example, where data processing system 200 is a hard disk drive, original input 205 may be a data set that is destined for storage on a storage medium. In such cases, a medium 240 of data processing system 200 is a storage medium. As another example, where data processing system 200 is a communication system, original input 205 may be a data set that is destined to be transferred to a receiver via a transfer medium. Such transfer mediums may be, but are not limited to, wired or wireless transfer mediums. In such cases, a medium 240 of data processing system 200 is a transfer medium.

Figure 2B:
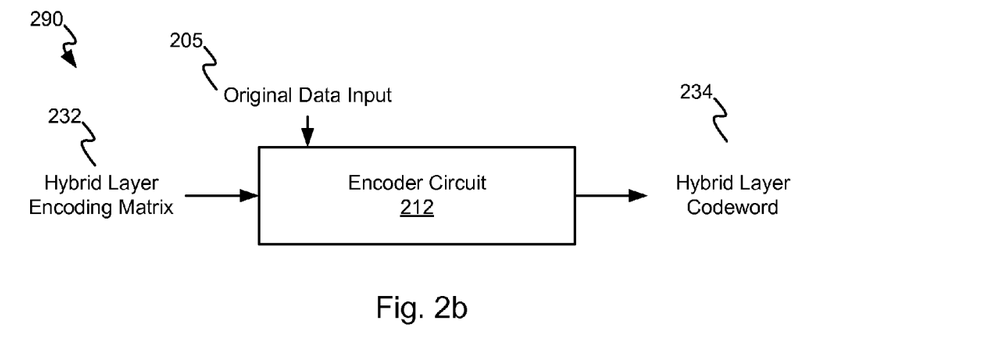
Figure 2C:
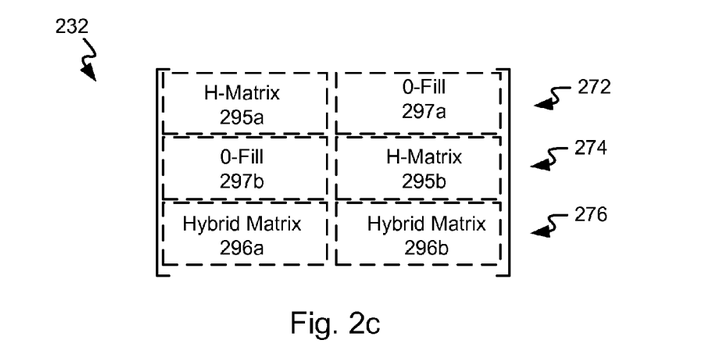
FIG. 2c graphically depicts an example hybrid layer encoding matrix comprising two component codewords that may be used in relation to one or more embodiments of the present invention.

Turning to FIG. 2b, a graphical depiction 290 of hybrid layer encoding circuit 220 is shown. As shown, original data input 205 is provided to an encoder circuit 212 where it is multiplied by a hybrid layer encoding matrix 232 to yield a hybrid layer codeword 234. FIG. 2c graphically depicts an example hybrid layer encoding matrix 232 comprising two component codewords that may be used in relation to one or more embodiments of the present invention. As shown hybrid layer encoding matrix 232 includes H-matrices 295 that when multiplied by a portion of original data input 205 yield a respective component codeword (i.e., a component codeword corresponding to H-matrix 295a and 0-fill matrix 297a of rows 272, and a component codeword corresponding to H-matrix 295b and 0-fill matrix 297b of rows 274), and hybrid matrices 296 that when multiplied by the portions of original data 205 yield respective hybrid portions (i.e., a hybrid portion corresponding to hybrid-matrix 296a and a hybrid portion corresponding to hybrid matrix 296b, with the combination of the hybrid portions from rows 276 yielding a hybrid encoding portion). As the name suggests, the 0-file matrices are matrices of all zeros. It should be noted that while FIG. 2c shows a hybrid layer encoding matrix for generating a hybrid layer codeword having two component codewords, other embodiments of the present invention may utilize an encoding matrix capable of generating a hybrid layer codeword having three or more component codewords. In one particular embodiment of the present invention, the portions of original data input 205 corresponding to each component codeword is 2K bits. Based upon the disclosure provided herein, one of ordinary skill in the art will recognize other portion sizes that may be used in relation to different embodiments of the present invention.

Figure 2D:
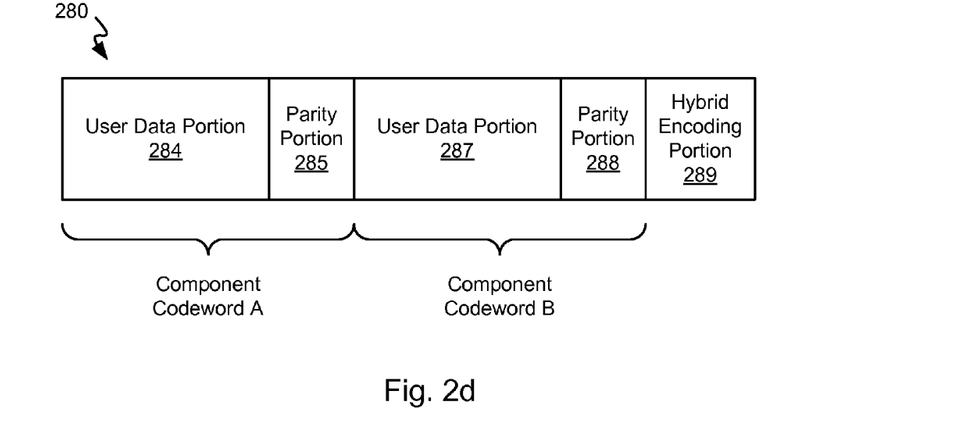
FIG. 2d graphically depicts a hybrid layer codeword resulting from application of the hybrid layer encoding matrix of FIG. 2c.

FIG. 2d graphically depicts a hybrid layer codeword 280 resulting from application of hybrid layer encoding matrix 232 to original data input 205. As shown, hybrid layer codeword 280 includes: a first component codeword (i.e., component codeword A) corresponding to row 272 of hybrid encoding matrix 232, a second component codeword (i.e., component codeword B) corresponding to row 274 of hybrid encoding matrix 232, and a hybrid encoding portion corresponding to row 276 of hybrid encoding matrix 232.

Returning to FIG. 2a, encoding circuit 220 provides the resulting hybrid layer codeword to a transmission circuit 230. Transmission circuit 230 may be any circuit known in the art that is capable of transferring the received codeword 225 via medium 240. Thus, for example, where data processing circuit 200 is part of a hard disk drive, transmission circuit 230 may include a read/write head assembly that converts an electrical signal into a series of magnetic signals appropriate for writing to a storage medium. Alternatively, where data processing circuit 200 is part of a wireless communication system, transmission circuit 230 may include a wireless transmitter that converts an electrical signal into a radio frequency signal appropriate for transmission via a wireless transmission medium. Transmission circuit 230 provides a transmission output to medium 240. Medium 240 provides a transmitted input that is the transmission output augmented with one or more errors introduced by the transference across medium 240.

Data processing circuit 200 includes a pre-processing circuit 250 that applies one or more analog functions to the transmitted input. Such analog functions may include, but are not limited to, amplification and filtering. Based upon the disclosure provided herein, one of ordinary skill in the art will recognize a variety of pre-processing circuitry that may be used in relation to different embodiments of the present invention. Pre-processing circuit 250 provides a pre-processed output to a hybrid layer based decoding circuit 260. Hybrid layer based decoding circuit 260 applies a decoding algorithm to hybrid layers of the received hybrid layer codeword sequentially. When a component codeword of a given hybrid layer converges, the soft data associated with that the hybrid layer is set to a maximum value. In this way, the values in the hybrid encoding portion of hybrid layer codeword are effectively frozen (in addition to the values of the converged component codeword) while another hybrid layer formed of another individual component codeword and the hybrid portion is decoded. As such, the added hybrid portion not only provides additional encoding that may be used to aid the data processing of a given component codeword, convergence of any of the component codewords will yield a known hybrid portion that further enhances the ability to correctly decode other component codewords within the hybrid layer codeword. The result of the decoding process is provided as a data output 265.

Figure 3:
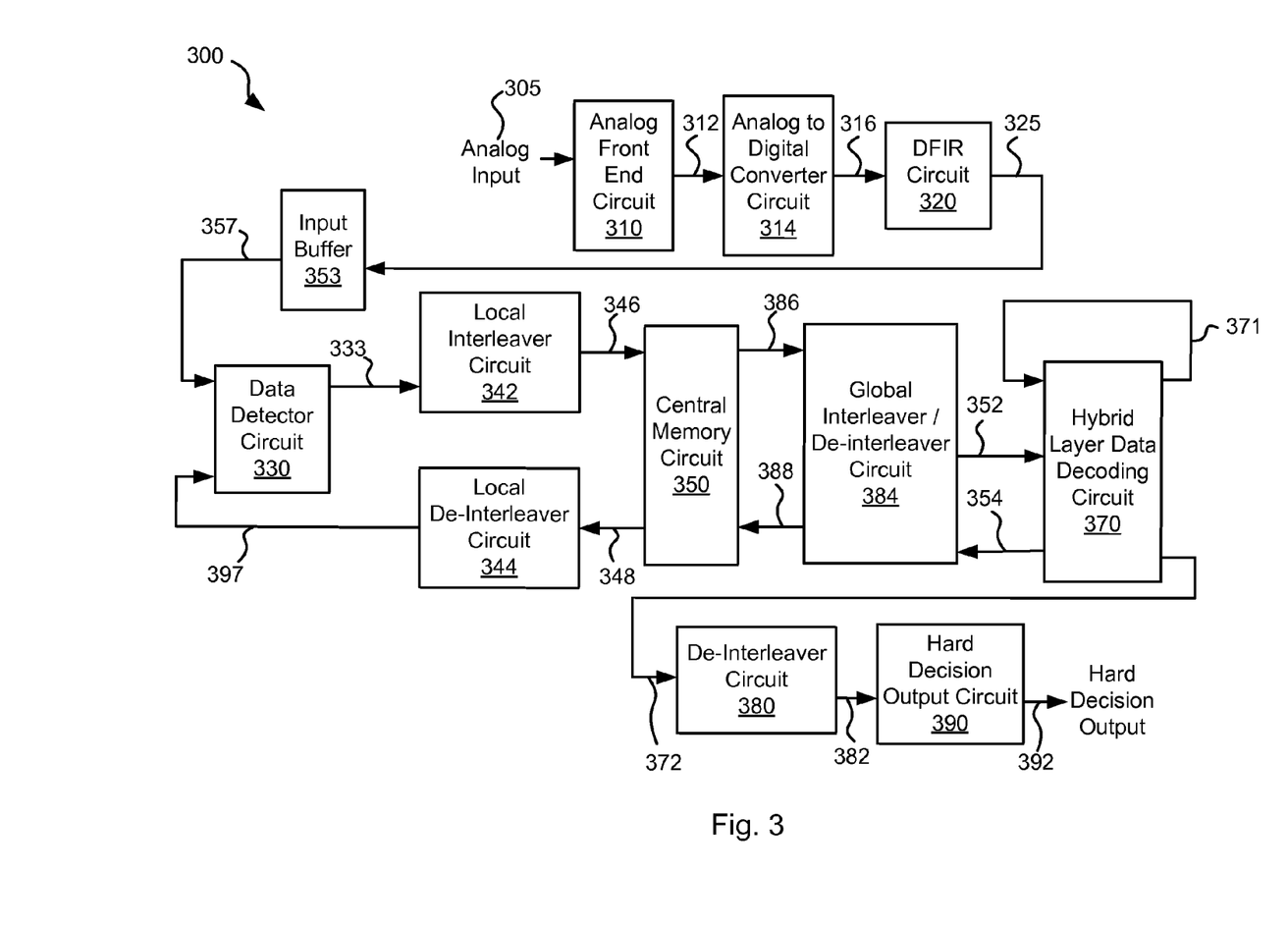
FIG. 3 shows a data processing circuit including a hybrid layer data decoding circuit in accordance with one or more embodiments of the present invention.

Turning to FIG. 3, a data processing circuit 300 is shown that includes a hybrid layer data decoding circuit 370 in accordance with one or more embodiments of the present invention. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. Analog signal 305 represents hybrid layer codewords that may be similar to that discussed above in relation to FIG. 2d where a number of component codewords are combined with hybrid encoding portions. In some cases, where data processing circuit 300 is implemented as part of a storage device, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter (DFIR) circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain one or more codewords until processing of that codeword is completed through a data detector circuit 330 and a hybrid layer data decoding circuit 370 including, where warranted, multiple global iterations (passes through both data detector circuit 330 and hybrid layer data decoding circuit 370) and/or local iterations (passes through hybrid layer data decoding circuit 370 during a given global iteration). An output 357 is provided to data detector circuit 330.

Data detector circuit 330 may be a single data detector circuit or may be two or more data detector circuits operating in parallel on different hybrid layer codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations.

Upon completion of application of the data detection algorithm to the received hybrid layer codeword on the first global iteration, data detector circuit 330 provides a detector output 333. Each instance of detector output 333 corresponds to a respective one of the hybrid layer received as analog input 305.

Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. In cases where a higher value of soft data indicates a greater likelihood that a corresponding bit or symbol of the hybrid layer codeword has been correctly determined, setting the soft data to a maximum value makes it very unlikely that the corresponding bit will be modified during subsequent decoding or detection processes. As such, the bit or symbol is effectively frozen. Similarly, in cases where a lower value of soft data indicates a greater likelihood that a corresponding bit or symbol of the hybrid layer codeword has been correctly determined, setting the soft data to a minimum value makes it very unlikely that the corresponding bit will be modified during subsequent decoding or detection processes. Detected output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once hybrid layer data decoding circuit 370 is available, a previously stored interleaved codeword 346 is accessed from central memory circuit 350 as a stored codeword 386 and globally interleaved by a global interleaver/de-interleaver circuit 384. Global interleaver/De-interleaver circuit 384 may be any circuit known in the art that is capable of globally rearranging codewords. Global interleaver/De-interleaver circuit 384 provides a decoder input 352 into hybrid layer data decoding circuit 370. Decoder input 352 may be a hybrid layer codeword similar to that discussed above in relation to FIG. 2d where a number of component codewords are combined with hybrid encoding portions. In some embodiments of the present invention, the data decode algorithm is a layered low density parity check algorithm as are known in the art. Based upon the disclosure provided herein, one of ordinary skill in the art will recognize other decode algorithms that may be used in relation to different embodiments of the present invention. Hybrid layer data decoding circuit 370 applies to data decode algorithm to decoder input 352 to yield a decoded output 371.

In operation, hybrid layer data decoding circuit 370 selects a first component codeword and the hybrid encoding portion as a first decoding layer. Using the example of FIG. 2c, hybrid layer data decoding circuit 370 selects, for example, the data in hybrid layer codeword corresponding to rows 272 and rows 276 is selected. As an example, rows 272 may include eight rows, and rows 276 may include two rows. Hybrid layer data decoding circuit 370 then applies the data decoding algorithm to the first decoding layer to yield a decoded output. This process of applying the data decode algorithm to the first decoding layer is repeated for a number of local iterations until either the component codeword associated with the first decoding layer converges, or until a maximum number of local iterations is exceeded. Where the first decoding layer converges, the soft data associated with the first decoding layer is set to values representing the highest likelihood that data associated with the first decoding layer is correctly determined. In this way, the values in the hybrid encoding portion are effectively frozen while another decoding layer formed of another individual component codeword and the hybrid encoding portion is decoded. This provides additional guidance to the decoding process applied to subsequent layers. Alternatively, where the first decoding layer fails to converge before the maximum number of local iterations has been exceeded, the soft data is left as it existed after the last local iteration. At this point, decoding of the first decoding layer is complete.

With the decoding of the first decoding layer completed, hybrid layer data decoding circuit 370 selects a second component codeword and the hybrid encoding portion as a second decoding layer. Using the example of FIG. 2c, hybrid layer data decoding circuit 370 selects, for example, the data in hybrid layer codeword corresponding to rows 274 and rows 276 is selected. As an example, rows 274 may include eight rows, and rows 276 may include two rows. Hybrid layer data decoding circuit 370 then applies the data decoding algorithm to the second decoding layer to yield a decoded output. This process of applying the data decode algorithm to the second decoding layer is repeated for a number of local iterations until either the component codeword associated with the second decoding layer converges, or until a maximum number of local iterations is exceeded. Where the second decoding layer converges, the soft data associated with the second decoding layer is set to values representing the highest likelihood that data associated with the second decoding layer is correctly determined. Again, in this way, the values in the hybrid encoding portion are effectively frozen while another decoding layer formed of another individual component codeword and the hybrid encoding portion is decoded. This provides additional guidance to the decoding process applied to subsequent layers.

This process of applying the data decode algorithm sequentially to decoding layers continues until all of hybrid codewords corresponding to individual component codewords are decoded. Thus, while the example in FIG. 2c implies a hybrid layer codeword comprised of two component codewords, data processing circuit 300 may operate on hybrid layer codewords exhibiting three or more component codewords. Where less than all of the individual component codewords converge, decoding of the hybrid layer codeword fails to converge. In such a case, the resulting decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where all of the individual component codewords converge, decoding of the hybrid layer codeword to converges (i.e., yields the originally written data set), the resulting decoded output is provided as an output codeword 372 to a de-interleaver circuit 380. De-interleaver circuit 380 rearranges the data to reverse both the global and local interleaving applied to the data to yield a de-interleaved output 382. De-interleaved output 382 is provided to a hard decision output circuit 390. Hard decision output circuit 390 is operable to re-order data sets that may complete out of order back into their original order. The originally ordered data sets are then provided as a hard decision output 392.

Figure 4:
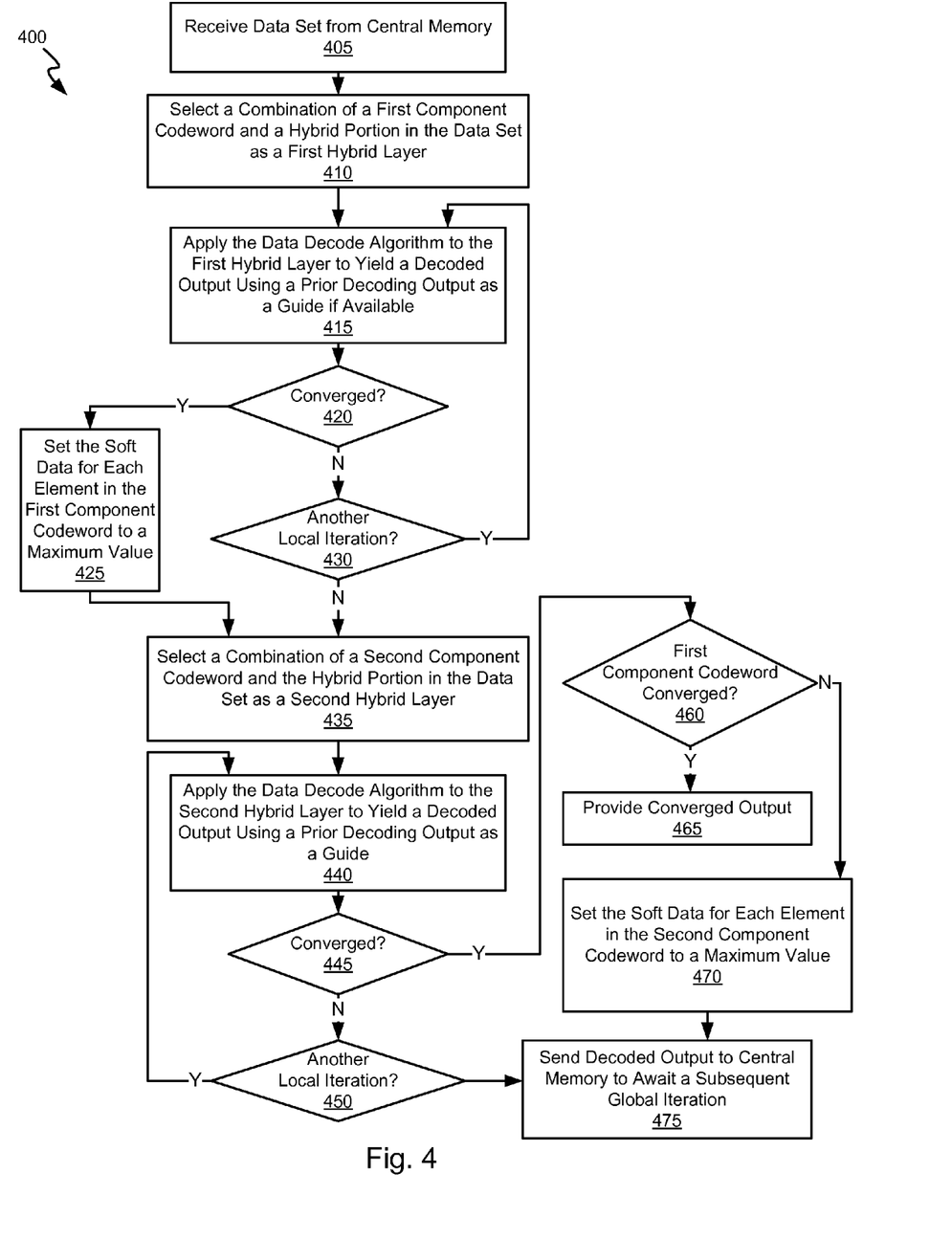
FIG. 4 is a flow diagram showing a method in accordance with some embodiments of the present invention for applying hybrid layer data decoding.

Turning to FIG. 4, a flow diagram 400 showing a method in accordance with some embodiments of the present invention for applying hybrid layer data decoding. Following flow diagram 400, a data set is received from the central memory (block 405). The data set is a hybrid layer codeword comprising two or more component codewords. As an example, such a hybrid layer codeword may be similar to that discussed above in relation to FIG. 2d. It should be noted that the process of flow diagram 400 is discussed in relation to a hybrid layer codeword that has two component codewords, but it should be noted that the process may be expanded to handle hybrid layer codewords comprising three or more component codewords.

A combination of a first component codeword and a hybrid encoding portion of the hybrid layer codeword is selected as a first decoding layer (block 410). A data decoding algorithm is applied to the first decoding layer to yield a decoding output (block 415). Where it is the second or later local iteration, a prior decoding output is used to guide application of the data decoding algorithm. It is determined whether application of the decoding algorithm resulted in convergence of the first decoding layer (bock 420). Where the first decoding layer converged (block 420), the soft data corresponding to the first decoding layer is set equal to a maximum value (i.e., a value indicating the highest likelihood that the data was properly decoded) (block 425). This effectively freezes the first decoding layer.

Alternatively, where the first decoding layer failed to converge (block 420), it is determined whether another local iteration through the data decoder circuit is allowed (block 430). As an example, in some cases each decoding layer is allowed ten (10) local iterations through the data decoder circuit. Based upon the disclosure provided herein, one of ordinary skill in the art will recognize other numbers of local iterations that may be allowed in accordance with different embodiments of the present invention. Where more local iterations are allowed (block 430), the processes of blocks 415-430 are reapplied to the first decoding layer guided by the previous decoding output.

Where either the first decoding layer converged (block 420) or the maximum number of local iterations have been surpassed (block 430), a combination of a second component codeword and the hybrid encoding portion of the hybrid layer codeword is selected as a second decoding layer (block 435). The data decoding algorithm is applied to the second decoding layer to yield a decoding output (block 440). The decoding output resulting from applying the data decoding algorithm to the first decoding layer is used to guide the first local iteration of the second decoding layer. This includes defacto frozen values for the hybrid encoding portion where the first decoding layer converged. Such frozen values improve the accuracy of the decoding algorithm applied to the second decoding layer. Where it is the second or later local iteration of the second decoding layer, a prior decoding output corresponding to the second decoding layer is used to guide application of the data decoding algorithm. It is determined whether application of the decoding algorithm resulted in convergence of the second decoding layer (bock 445). Where the second decoding layer converged (block 445), it is determined whether the first decoding layer converged (block 460). Where the first decoding layer converged (block 460), all of the decoding layers in the hybrid layer codeword have converged, and thus the converged output is provided to a requestor (block 465).

Alternatively, where the first decoding layer failed to converge (block 460), less than all of the decoding layers of the hybrid layer codeword have converged, and thus additional processing may be desired. In such a case, the soft data corresponding to the second decoding layer is set equal to a maximum value (i.e., a value indicating the highest likelihood that the data was properly decoded) (block 470). This effectively freezes the second decoding layer. At this point, the resulting decoded output is sent back to the central memory to await a subsequent global iteration (block 475).

Where the second decoding layer failed to converge (block 445), it is determined whether another local iteration through the data decoder circuit is allowed (block 450). As an example, in some cases each decoding layer is allowed ten (10) local iterations through the data decoder circuit. Based upon the disclosure provided herein, one of ordinary skill in the art will recognize other numbers of local iterations that may be allowed in accordance with different embodiments of the present invention. Where more local iterations are allowed (block 450), the processes of blocks 440-470 are reapplied to the second decoding layer guided by the previous decoding output. Where another local iteration is not allowed (block 450), the resulting decoded output is sent back to the central memory to await a subsequent global iteration (block 475).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data decoder circuit operable to:
        select a combination of a first portion of a received codeword and a second portion of the received codeword as a first codeword layer;
        apply a data decode algorithm to the first codeword layer to yield a first decoded output;
        where the first decoded output converged, set soft data in the first decoded output to a value indicating a high probability of being correctly decoded;
        select a combination of a third portion of the received codeword and the second portion of the received codeword as a second codeword layer; and
        apply the data decode algorithm to the second codeword layer guided by the first decoded output to yield a second decoded output.

2. The data processing system of claim 1, wherein the data decode algorithm is a low density parity check algorithm.

3. The data processing system of claim 1, wherein the data processing system further comprises:
    a data detector circuit operable to apply a data detection algorithm to a data input to yield a detected output, wherein the received codeword is derived from the detected output.

4. The data processing system of claim 3, wherein the data detection algorithm is selected from a group consisting of: a maximum a posteriori data detection algorithm, and a Viterbi data detection algorithm.

5. The data processing system of claim 3, wherein the data processing system is part of a data storage device including a storage medium, and wherein the data input is derived from the storage medium.

6. The data processing system of claim 3, wherein the data processing system is part of a communication device operable to receive information from a data transfer medium, and wherein the data input is derived from the information.

7. The data processing system of claim 1, wherein the data decoder circuit is further operable to:
    set soft data in the second decoded output to a value indicating a high probability of being correctly decoded when the second decoded output converged.

8. The data processing system of claim 7, wherein the data decoder circuit is further operable to:
provide a data output including a combination of the first decoded output and the second decoded output when both the first decoded output and the second decoded output converged.

9. The data processing system of claim 1, wherein the data processing system is implemented as part of an integrated circuit.

10. The data processing system of claim 1, wherein the data processing system further comprises:
a data encoder circuit operable to encode a user data set to yield the received codeword, wherein the first portion of the received codeword corresponds to a first component codeword and the third portion of the received codeword corresponds to a second component codeword.

11. A method for data processing, the method comprising:
receiving a codeword;
selecting a combination of a first portion of the codeword and a second portion of the codeword as a first codeword layer;
applying a data decode algorithm by a data decoder circuit to the first codeword layer to yield a first decoded output;
where the first decoded output converged, setting soft data in the first decoded output to a value indicating a high probability of being correctly decoded;
selecting a combination of a third portion of the codeword and the second portion of the received codeword as a second codeword layer; and
applying the data decode algorithm to the second codeword layer guided by the first decoded output to yield a second decoded output.

12. The method of claim 11, the method further comprising: receiving a data input;
applying a data detection algorithm to the data input to yield a detected output, wherein the codeword is derived from the detected output.

13. The method of claim 12, wherein the data detection algorithm is selected from a group consisting of: a maximum a posteriori data detection algorithm, and a Viterbi data detection algorithm.

14. The method of claim 12, wherein the method further comprises:
accessing information from a storage medium, wherein the data input is derived from the information.

15. The method of claim 12, wherein the method further comprises:
accessing information from a communication medium, wherein the data input is derived from the information.

16. The method of claim 11, wherein the data decode algorithm is a low density parity check algorithm.

17. The method of claim 11, wherein the method further comprises:
encoding a user data set to yield the codeword, wherein the first portion of the received codeword corresponds to a first portion of the user data set and the third portion of the codeword corresponds to a second portion of the user data set.

18. A storage device, the storage device comprising:
a storage medium;
a head assembly disposed in relation to the storage medium and operable to provide a sensed signal corresponding to a data set on the storage;
a read channel circuit including:
an analog front end circuit operable to provide an analog signal corresponding to the sensed signal;
an analog to digital converter circuit operable to sample the analog signal to yield a series of digital samples;
an equalizer circuit operable to equalize the digital samples corresponding to the data set to yield a data set;
a data detector circuit operable to apply a data detection algorithm to the data set to yield a detected output; and
a data decoder circuit operable to:
select a combination of a first portion of a codeword and a second portion of the codeword as a first codeword layer, wherein the codeword is derived from the detected output;
apply a data decode algorithm to the first codeword layer to yield a first decoded output;
where the first decoded output converged, set soft data in the first decoded output to a value indicating a high probability of being correctly decoded;
select a combination of a third portion of the codeword and the second portion of the codeword as a second codeword layer; and
apply the data decode algorithm to the second codeword layer guided by the first decoded output to yield a second decoded output.

19. The storage device of claim 18, wherein the data decoder circuit is further operable to:
set soft data in the second decoded output to a value indicating a high probability of being correctly decoded when the second decoded output converged.

20. The storage device of claim 18, wherein the read channel circuit further comprises:
a data encoder circuit operable to encode a user data set to yield the codeword, wherein the first portion of the codeword corresponds to a first portion of the user data set and the third portion of the codeword corresponds to a second portion of the user data set.

* * * * *